United States Patent [19]
Gotoh

[11] Patent Number: 5,703,819
[45] Date of Patent: Dec. 30, 1997

[54] SENSE AMPLIFIER DRIVING CIRCUIT

[75] Inventor: Kohtaroh Gotoh, Kawasaki, Japan

[73] Assignee: Fujitsu Limited, Kanagawa, Japan

[21] Appl. No.: 819,509

[22] Filed: Mar. 17, 1997

[30] Foreign Application Priority Data

Jun. 11, 1996 [JP] Japan .................... 8-149362

[51] Int. Cl.[6] .................................. G11C 13/00
[52] U.S. Cl. .......................... 365/203; 365/154
[58] Field of Search ........................ 365/154, 203, 365/189.01, 230.08

[56] References Cited

U.S. PATENT DOCUMENTS 5,528,541 6/1996 Ghia et al. .................. 365/203

*Primary Examiner*—Terrell W. Fears
*Attorney, Agent, or Firm*—Nikaido Marmelstein Murray & Oram LLP

[57] ABSTRACT

A sense amplifier driving circuit includes bit-line connection transistors connected to link bit lines on the side of memory cells with bit lines on the side of a sense amplifier, a circuit for controlling ON/OFF operations of the bit-line connection transistors, and first and second capacitors coupled to respective sources of nMOS transistors and pMOS transistors constituting the sense amplifier. After a word line linked to the memory cell is turned ON to output cell data to the bit lines, the potentials at input gates of the bit-line connection transistors are lowered to a level permitting narrowing-down of a current flowing in the bit lines. Moreover, after the sense amplifier is activated, a difference voltage between the bit lines on the side of the sense amplifier is amplified sufficiently, and then a data read operation is completed. Thereafter, the bit-line connection transistors are turned ON to overdrive the sense amplifier through the first and second capacitors. This constitution contributes to a realization of a sense amplifier that can operate with a low power consumption and at high speed even at a low supply voltage.

7 Claims, 5 Drawing Sheets

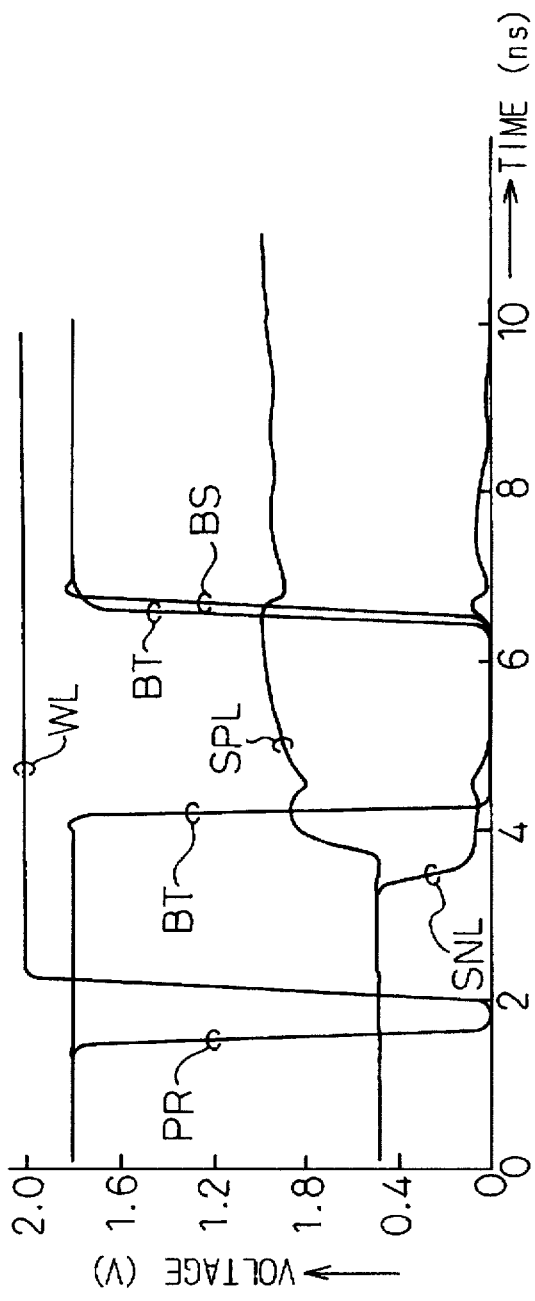
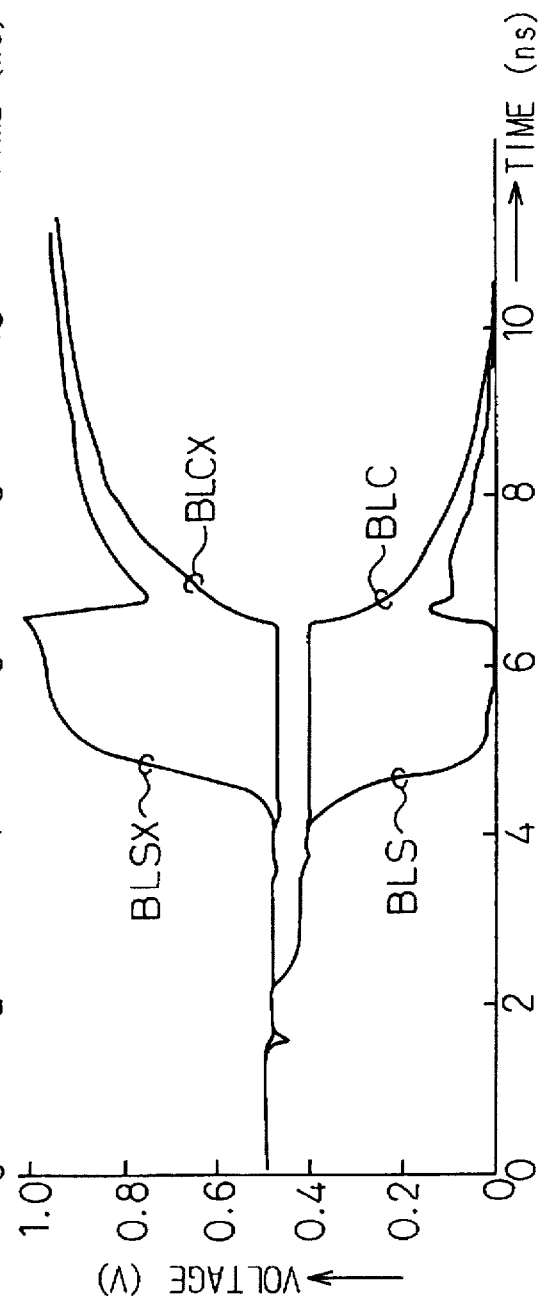
Fig.4a
Fig.4b

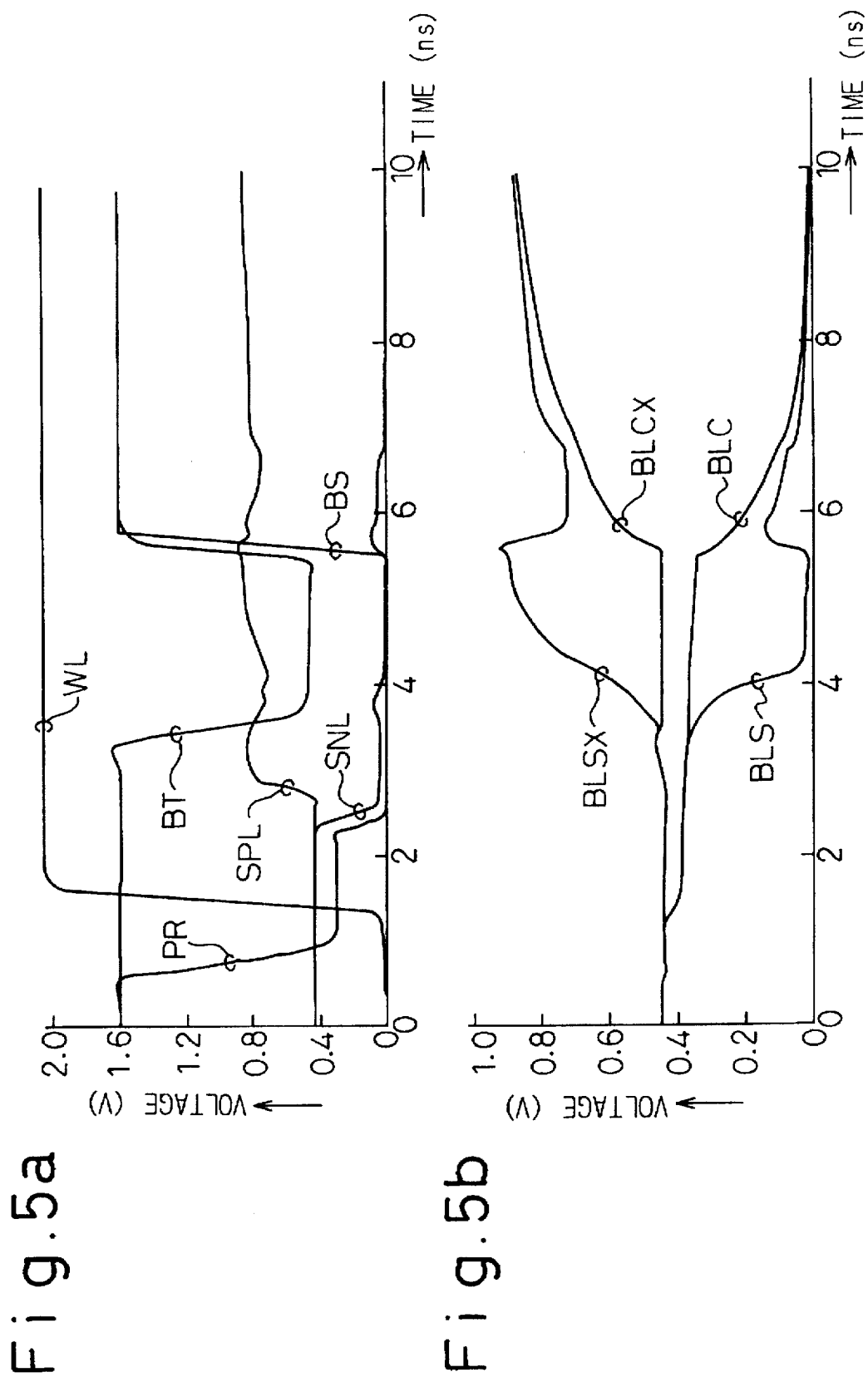

SENSE AMPLIFIER DRIVING CIRCUIT

BACKGROUND OF THE INVENTION

1. Field of the Invention

The present invention relates to a semiconductor memory, more particularly, to a driving circuit for a sense amplifier in a dynamic random access memory (DRAM).

A semiconductor memory is, like a CPU, a part indispensable to machines ranging from mainframe computers to home electric appliances. In particular, a DRAM is employed as main memory in computers ranging from mainframe computers to personal computers. The storage capacities of DRAMs, as well as hard disks, are getting larger and larger.

2. Description of the Related Art

In the past, many systems have been proposed as a system for reading data from a memory cell in a DRAM. At present, a DRAM adopting a Vcc/2 pre-charge system is the mainstream device.

A Vcc/2 pre-charge system is a system in which the circuitry comprises, as shown in FIG. 1a, a sense amplifier SA of a CMOS constitution made by connecting two nMOS transistors Q1 and Q2 and two pMOS transistors between complementary bit lines BL and BLX so that each pair of transistors constitutes a flip-flop, and two nMOS transistors Q5 and Q6 connected in series with each other between the bit lines BL and BLX; a circuit PC for pre-charging the bit lines to half the potential of a supply voltage Vcc prior to activation of the sense amplifier which is combined with the circuitry; and cell data is read from a memory cell MC composed of one transistor (Q) and one capacitor (C) which are located at an intersection between a word line WL and the bit lines BL and BLX. Herein, a node between the pre-charge transistors Q5 and Q6 is linked to a Vcc/2 supply line that is a supply line whose line voltage is a half of the supply voltage Vcc.

FIG. 1b shows an example of a driving wave. In the drawing, ΔV denotes a difference voltage developing between the bit lines BL and BLX after the word line WL is activated. $V_{TN}$ denotes a threshold level of an nMOS transistor, and $V_{TP}$ denotes a threshold level of a pMOS transistor. As illustrated, it is seen that the difference voltage ΔV between the bit lines BL and BLX is sufficiently amplified according to the Vcc/2 pre-charge system and a data reading operation is completed.

As the degree of integration of a DRAM increases, the length of a gate of a transistor (design dimension) decreases and a supply voltage (Vcc) drops. In particular, for realizing the degree of integration of 1 gigabit (Gb) or higher, the supply voltage is thought to range from about 1 V to 1.5 V because of various conditions including reliability such as the endurance of the transistor to a high voltage, power consumption, and the like. On the other hand, when consideration is taken into an increase in power consumption due to a difference of a process from another or a sub threshold current, it is hard to scale the threshold voltage of a transistor as well as the supply voltage. When it becomes impossible to scale the threshold voltage of a transistor, there arises a problem that the switching speed of the transistor is lowered with a drop in supply voltage.

In particular, when consideration is taken into driving a sense amplifier using the Vcc/2 pre-charge system shown in FIGS. 1a and 1b, there arises a problem that the operating speed of the sense amplifier (that is, the speed of reading data from a DRAM cell) deteriorates markedly because of a back-gate effect attributable to the fact that the potentials at the sources and drains of nMOS transistors of the sense amplifier constituting a flip-flop is Vcc/2 that is a half of a supply voltage Vcc takes place and an effective gate bias voltage becomes ($Vcc/2-V_{TP}$).

In an effort to solve the foregoing problems, a system for speeding up the operations of a sense amplifier, for example, an overdrive sense amplifier system or well-drive system has been proposed. As for the overdrive sense amplifier system, refer to, for example, a paper written by T. Yamagata et al. carried in "ISSCC Dig. of Tech. Papers (pp. 113–114, February 1995)." For the well-drive system, refer to, for example, a paper written by M Nakamura et al. carried in "ISSCC DIg. of Tech. Papers (pp. 246–247, Feb. 1995)."

However, the overdrive sense amplifier system has a problem in terms of a power consumption because a boosted voltage, higher than a supply voltage in a chip, is usually used to drive a pMOS amplifier transiently. By contrast, in the well-drive system, a currently-reported access time, that is, a time required until a data line becomes open after a sense amplifier is activated is relatively long and is 10 nsec. or longer, and thus a sufficiently high operating speed is not attained.

SUMMARY OF THE INVENTION

An object of the present invention is to provide a driving circuit which can contribute to the realization of a sense amplifier that operates at low power consumption and with high speed even at a low supply voltage.

According to the present invention, there is provided a circuit for driving a flip-flop type sense amplifier of a CMOS constitution in a dynamic random access memory, comprising: bit-line connection transistors connected to link bit lines on the side of memory cells with bit lines on the side of the sense amplifier; a circuit for controlling the ON/OFF operations of the bit-line connection transistors; and first and second capacitors coupled to respective sources of nMOS transistors and pMOS transistors of the sense amplifier, wherein: after a word line linked to the memory cell is turned ON to output cell data to the bit lines, the potentials at input gates of said bit-line connection transistors are lowered to a level permitting narrowing-down of a current flowing in said bit lines; and after the sense amplifier is activated, a difference voltage between the bit lines on the side of said sense amplifier is amplified sufficiently, and when the data read operation is completed, the bit-line connection transistors are turned ON to overdrive the sense amplifier through the first and second capacitors.

According to the constitution, after the word line is turned ON to output cell data to the bit lines, when the bit-line connection transistors are temporarily turned OFF to transiently disconnect the bit lines on the side of the sense amplifier from the bit lines on the side of the memory cells, a load capacitance of the sense amplifier is reduced to only the capacitances of the bit lines on the side of the sense amplifier.

Thereby, charges present on the bit lines on the side of the sense amplifier, which are used for charging or result from discharging, are relatively decreased. Consequently, the operation for amplifying a difference voltage between the bit lines required for reading data can be speeded up.

Furthermore, after a data read operation is completed, the bit-line connection transistors are turned ON to overdrive the sense amplifier through the first and second capacitors coupled to the sources of the CMOS transistors constituting the sense amplifier. Consequently, the operation for amplifying a difference voltage between the bit lines on the side of the memory cells is speeded up.

On the other hand, when the bit-line connection transistors are turned OFF, the potentials at the input gates of the transistors are not dropped to a required level or lower, but remain at a level permitting narrowing-down of a current (charges) flowing in the bit lines. A current consumption required for turning ON the bit-line connection transistors on a subsequent stage can therefore be reduced. This contributes to an attainment of a lower power consumption in the whole circuit.

BRIEF DESCRIPTION OF THE DRAWINGS

Other objects and features of the present invention will be described hereinafter in detail by way of preferred embodiments with reference to the accompanying drawings, in which:

FIGS. 4a and 4b are diagrams showing a second example of the operating waveforms in the circuit shown in FIG. 2; and FIGS. 5a and 5b are diagrams showing a third example of the operating waveforms in the circuit shown in FIG. 2.

DESCRIPTION OF THE PREFERRED EMBODIMENTS

Figure 1A:
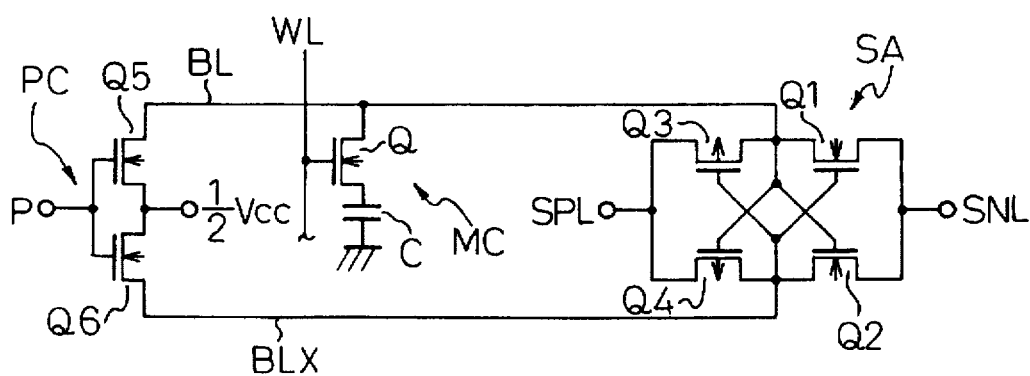
FIGS. 1a and 1b are diagrams for explaining a conventional Vcc/2 pre-charge system.
Figure 1B:
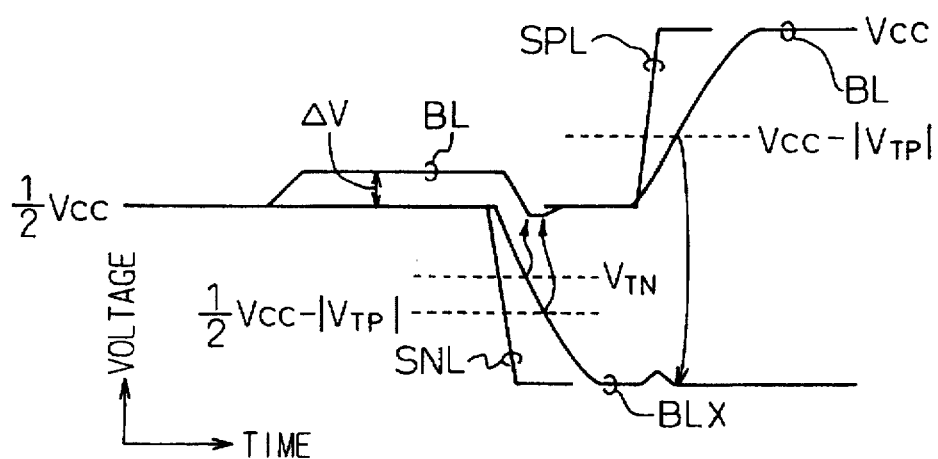
Figure 2:
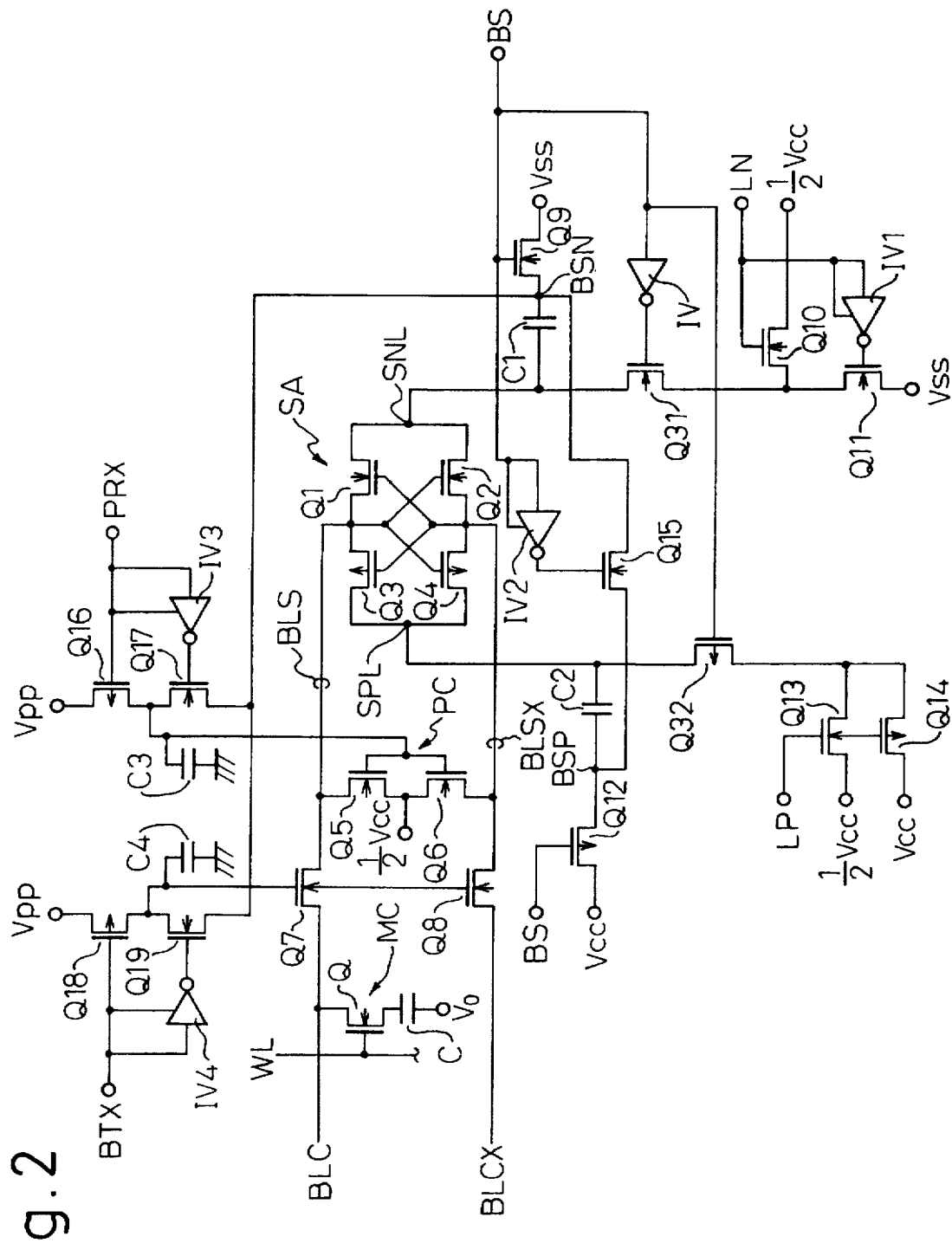
FIG. 2 is a diagram showing a constitution of the sense amplifier driving circuit in accordance with an embodiment of the present invention.

FIG. 2 shows the configuration of a sense amplifier driving circuit in accordance with an embodiment of the present invention.

In the drawing, there is shown a memory cell (DRAM cell) MC composed of one transistor (Q) and one capacitor (C) and located at an intersection between each word line WL and complementary bit lines BLC and BLCX. Also shown is a sense amplifier SA of a CMOS constitution made by connecting two nMOS transistors Q1 and Q2 and two pMOS transistors Q3 and Q4 so that each pair of the transistors constitutes a flip-flop. The sense amplifier SA is connected between complementary bit lines BLS and BLSX on the side of the sense amplifier. Moreover, there is shown a Vcc/2 pre-charge circuit PC that pre-charges the bit lines to half the potential of the supply voltage Vcc prior to activation of the sense amplifier SA, and that has the circuitry where two nMOS transistors Q5 and Q6 are connected in series with each other between the bit lines BLS and BLSX on the side of the sense amplifier. A node between the pre-charge transistors Q5 and Q6 is linked to a Vss/2 power line or a power line whose line voltage is a half of the supply voltage Vcc.

Bit-line connection nMOS transistors Q7 and Q8, which are constituent features of the present invention, are connected to link the bit lines BLC and BLCX on the side of the memory cell with the bit lines BLS and BLSX on the side of the sense amplifier.

Moreover, one terminal of a capacitor C1 is connected to sources (node SNL) of the nMOS transistors Q1 and Q2 of the sense amplifier SA, and the other terminal thereof (node BSN) is connected to a low-potential (=0 V) power line Vss via an nMOS transistor Q9. A control signal BS used to overdrive the sense amplifier SA is applied to the gate of the transistor Q9. Furthermore, the node SNL is connected to the Vcc/2 power line via an nMOS transistor Q10 and to the power line Vss via an nMOS transistor Q11. A control signal LN used to activate the sense amplifier SA and pre-charge the bit lines is applied to the gate of the transistor Q10. The control signal LN is applied to the gate of the transistor Q11 via a pulse driver IV1.

On the other hand, one terminal of a capacitor C2 is connected to (node SPL) sources of the pMOS transistors Q3 and Q4 of the sense amplifier SA, and the other terminal thereof (node BSP) is connected to a high-potential power line Vcc via a pMOS transistor Q12. A control signal BS is applied to the gate of the transistor Q12. Furthermore, the node SPL is connected to the Vcc/2 power line via an nMOS transistor Q13 and to the power line Vcc via a pMOS transistor Q14. A control signal LP used to activate the sense amplifier SA and pre-charge the bit lines is applied to the gates of the transistors Q13 and Q14.

Moreover, a charge transfer nMOS transistor Q15, which is one of the constituent features of the present invention, is connected between the other terminal (node BSN) of the capacitor C1 and the other terminal (node BSP) of the capacitor C2. A control signal BS is applied to the gate of the transistor Q15 via a pulse driver IV2.

Moreover, a pMOS transistor Q16 and nMOS transistor Q17 are connected in series with each other between the high-potential power line Vpp and the other terminal (node BSN) of the capacitor C1. A control signal PRX that is active low and used to control the ON/OFF states of the pre-charge transistors Q5 and Q6 is applied to the gate of the transistor Q16. The control signal PRX is applied to the gate of the transistor Q17 via a pulse driver IV3. A node between drains of the transistors Q16 and Q17 is grounded via a line capacitor C3 and connected to the input gates of the pre-charge transistors Q5 and Q6. The transistor Q17 connected between the line capacitor C3 and the other terminal (node BSN) of the capacitor C1 has the capability of a charge transfer transistor which is one of the constituent features of the present invention.

Likewise, a pMOS transistor Q18 and nMOS transistor Q19 are connected in series with each other between the power line Vpp and the other terminal (node BSN) of the capacitor C1. A control signal BTX that is active low and used to control the ON/OFF states of the bit-line connection transistors Q7 and Q8 is applied to the gate of the transistor Q18. The control signal BTX is applied to the gate of the transistor Q19 via a pulse driver IV4. A node between drains of the transistors Q18 and Q19 is grounded via a line capacitor C4 and connected to the input gates of the bit-line connection transistors Q7 and Q8. The transistor Q19 connected between the line capacitor C4 and the other terminal (node BSN) of the capacitor C1 has the capability of a charge transfer transistor which is one of the constituent features of the present invention.

Next, the operations of the sense amplifier driving circuit in accordance with an embodiment will be described with reference to the driving waveform diagrams of FIGS. 3a to 5b together with FIG. 2.

Figures 3A, 3B:
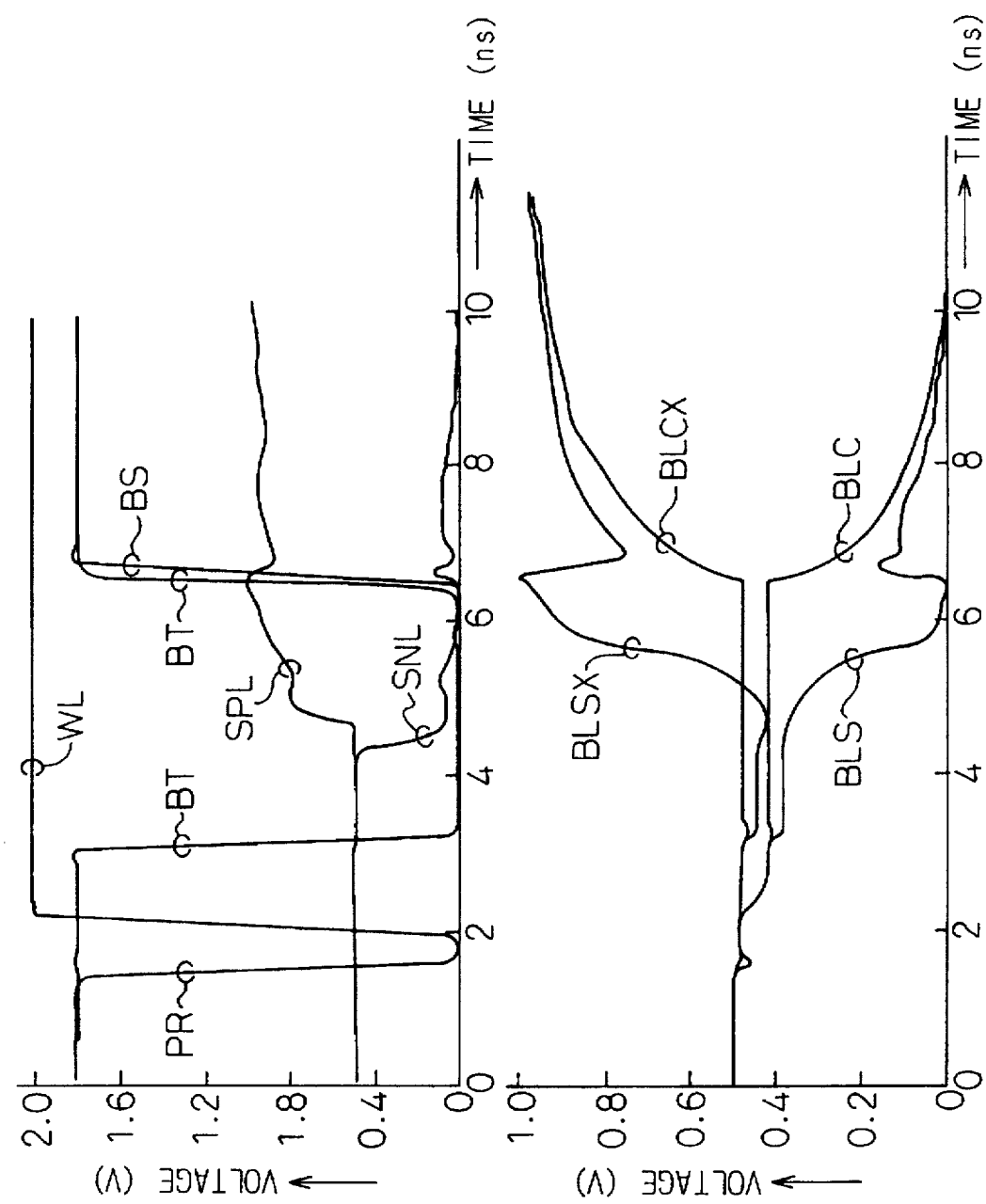
FIGS. 3a and 3b are diagrams showing a first example of the operating waveforms in the circuit shown in FIG. 2.

In an example of operations shown in FIGS. 3a and 3b, first, before a word line WL is turned ON, the bit-line connection transistors Q7 and Q8 are turned ON. Before the sense amplifier SA is activated, a control signal PR (complementary signal of the signal PRX) is used to pre-charge the nodes BSN and BSP to potentials equal to the voltages Vcc and Vss respectively.

After the word line WL is turned ON in order to output cell data to the bit lines, a control signal BT (complementary signal of the signal BTX) is used to lower the potentials at the input gates of the bit-line connection transistors Q7 and Q8 to a threshold level (Vth) or lower (0 V in the illustrated example) and to thus turn OFF the transistors. Thereafter, the sense amplifier SA is activated. After a difference voltage between the bit lines (BLS and BLSX) on the side of the sense amplifier SA is amplified sufficiently and a data reading operation is completed, the control signal BT is used to turn ON the bit-connection transistors Q7 and Q8 again. Thereafter, the control signal BS is used to set the potential at the nodes BSN and BSP to potentials equal to the voltages Vss and Vcc respectively. Owing to the actions of the capacitors C1 and C2, the sources (nodes SNL and SPL) of the transistors of the sense amplifier SA are overdriven.

In the foregoing example of operations, after the bit-line connection transistors Q7 and Q8 are turned OFF, the sense amplifier SA is activated. On the contrary, after the sense amplifier SA is activated, the bit-line connection transistors Q7 and Q8 may be turned OFF. FIGS. 4a and 4b show an example of operations in this alternative mode.

In the foregoing example of operations shown in FIGS. 3a to 4b, when the bit-line connection transistors Q7 and Q8 are turned OFF, the potentials at the input gates thereof are dropped to the threshold level Vth or lower. A turnoff mode is not limited to this one. Alternatively, for example, a level permitting narrowing-down of a current flowing into the bit lines (for example, a level Vcc/2) will do. FIGS. 5a and 5b show an example of operations in this alternative mode.

In the example of operations shown in FIGS. 5a and 5b, the potentials (comparable to the level of the control signal BT) at the input gates of the bit-line connection transistors Q7 and Q8 are not dropped to the level (0 V) shown in FIGS. 3a and 4a but are kept at a level of approximately 0.5 V. This makes it possible to reduce a current consumption required for turning ON the bit-line connection transistors Q7 and Q8 again at a subsequent stage.

As described so far, according to the sense amplifier driving circuit of the embodiment, after a word line is turned ON in order to output cell data to the bit lines, the bit-line connection transistors Q7 and Q8 are transiently turned OFF in order to disconnect the bit lines (BLS and BLSX) on the side of the sense amplifier from the bit lines (BLC and BLCX) on the side of the memory cell. Thereby, a capacitive load on the sense amplifier SA is reduced by that imposed by the bit lines on the side of the sense amplifier. Consequently, charges present on the bit lines on the side of the sense amplifier used for charging (or resulting from discharging) diminish relatively. The operation for amplifying a difference voltage between the bit lines required for reading data can be speeded up.

Furthermore, after a data reading operation is completed, the bit-line connection transistors Q7 and Q8 are turned ON again. Thereby, the sense amplifier SA is overdriven through the capacitors C1 and C2 coupled with the sources of the CMOS transistors constituting the sense amplifier SA. Consequently, the operation for amplifying a difference voltage between the bit lines on the side of the memory cell is speeded up.

Moreover, when the bit-line connection transistors Q7 and Q8 are turned OFF, as shown in the examples of operating waveforms in FIGS. 5a and 5b, the potentials at the input gates thereof are retained at a minimum necessary level. This makes it possible to reduce the current consumption required for turning ON the transistors again on a subsequent stage. This contributes to attaining a lower power consumption in the whole circuit.

Moreover, after a Vcc/2 pre-charge operation for the bit lines is completed, the charge transfer transistor Q17 is turned ON. Charge at the input gates of the pre-charge transistors Q5 and Q6, which results from discharge and is to be released to the power line Vss can be utilized to pre-charge the capacitor C1 for use in overdriving the sense amplifier SA. In other words, part of charge at the input gates of the pre-charge transistors Q5 and Q6 resulting from discharge can be used to pre-charge the capacitor C1. This is helpful in minimizing power consumption.

Moreover, when the bit-line connection transistors Q7 and Q8 are transiently turned OFF, the charge transfer transistor Q19 is turned ON. This makes it possible to use charge present at the input gates of the bit-line connection transistors Q7 and Q8, which results from discharge, to pre-charge the capacitor C1 for use in overdriving the sense amplifier SA. In short, charge at the input gates of the bit-line transistors Q7 and Q8 resulting from discharge can be partly used to pre-charge the capacitor C1. This is helpful in minimizing power consumption.

Moreover, after the potentials at the nodes BSN and BSP are set to potentials equal to the voltages Vss and Vcc respectively, when the sources (nodes SNL and SPL) of the transistors of the sense amplifier SA are overdriven, the charge transfer transistor Q15 is turned ON. This makes it possible to use charge resulting from discharge of the capacitor C1 to charge the capacitor C2. This is helpful in minimizing power consumption.

Furthermore, charge at the input gates of the precharge transistors Q5 and Q6 resulting from discharge, charge at the input gates of the bit-line connection transistors Q7 and Q8 resulting from discharge, and charge resulting from discharge of the capacitor C1 are used in combination appropriately, whereby a lower power consumption can be attained.

What is claimed is:

1. A sense amplifier driving circuit for driving a flip-flop type sense amplifier of a CMOS constitution in a dynamic random access memory, comprising:

bit-line connection transistors connected to link bit lines on the side of memory cells with bit lines on the side of said sense amplifier;

a circuit for controlling ON/OFF operations of said bit-line connection transistors; and first and second capacitors coupled to respective sources of nMOS transistors and pMOS transistors of said sense amplifier, wherein: after a word line linked to said memory cell is turned ON to output cell data to said bit lines, the potentials at input gates of said bit-line connection transistors are lowered to a level permitting narrowing-down of a current flowing in said bit lines; and after said sense amplifier is activated, a difference voltage between said bit lines on the side of said sense amplifier is amplified sufficiently, and then a data read operation is completed, said bit-line connection transistors are turned ON to overdrive said sense amplifier through said first and second capacitors.

2. The sense amplifier driving circuit according to claim 1, further comprising transistors for pre-charging said bit lines to a Vcc/2 potential, where Vcc is a supply voltage, before said sense amplifier is activated, wherein: a charge transfer transistor is provided between respective input gates of said pre-charge transistors and said first capacitor; and, after a Vcc/2 pre-charge operation for said bit lines is completed, said charge transfer transistor is turned ON to use charges at the input gates of said pre-charge transistors to thereby pre-charge said first capacitor.

3. The sense amplifier driving circuit according to claim 1, wherein: a charge transfer transistor is provided between the input gates of said bit-line connection transistors and said first capacitor; and when charges at the input gates of said bit-line connection transistors are discharged, said charge transfer transistor is turned ON to use said charges to thereby pre-charge said first capacitor.

4. The sense amplifier driving circuit according to claim 1, further comprising transistors for pre-charging said bit lines to a Vcc/2 potential, where Vcc is a supply voltage, before said sense amplifier is activated, wherein: a first charge transfer transistor and a second charge transfer transistor are provided between respective input gates of said pre-charge transistors and of said bit-line connection transistors and said first capacitor; after a Vcc/2 pre-charge operation for said bit lines is completed, said first charge transfer transistor is turned ON to use charges at the input gates of said pre-charge transistors to thereby pre-charge said first capacitor; and, thereafter, when charges at the input gates of said bit-line connection transistors are discharged, said second charge transfer transistor is turned ON to use said charges to thereby pre-charge said first capacitor.

5. The sense amplifier driving circuit according to claim 1, wherein: a charge transfer transistor is provided between said first capacitor and said second capacitor; and when said sense amplifier is overdriven, said charge transfer transistor is turned ON to use the charges resulting from discharge of said capacitor to thereby charge said second capacitor.

6. The sense amplifier driving circuit according to claim 1, further comprising first and second transistors connected to respective sources of said nMOS transistors and said pMOS transistors of said sense amplifier, said first and second transistors being turned OFF when said sense amplifier is overdriven by said first and second capacitors.

7. A sense amplifier driving circuit for driving a flip-flop type sense amplifier of a CMOS constitution in a dynamic random access memory, comprising:

bit-line connection transistors connected to link bit lines on the side of memory cells with bit lines on the side of said sense amplifier;

a circuit for controlling ON/OFF operations of said bit-line connection transistors; and first and second capacitors coupled to respective sources of nMOS transistors and pMOS transistors of said sense amplifier, wherein: after a word line linked to said memory cell is turned ON to output cell data to said bit lines, said sense amplifier is activated and then the potentials at input gates of said bit-line connection transistors are lowered to a level permitting narrowing-down of a current flowing in said bit lines; and a difference voltage between said bit lines on the side of said sense amplifier is amplified sufficiently, and then a data read operation is completed, said bit-line connection transistors are turned ON to overdrive said sense amplifier through said first and second capacitors.

* * * * *